(12) United States Patent
Chang et al.

(10) Patent No.: US 9,869,708 B2
(45) Date of Patent: Jan. 16, 2018

(54) INTEGRATED CIRCUIT PROTECTION DURING HIGH-CURRENT ESD TESTING

(71) Applicant: International Business Machines Corporation, Armonk, NY (US)

(72) Inventors: Shunhua Chang, South Burlington, VT (US); James Paul Di Sarro, Plano, TX (US); Robert J. Gauthier, Jr., Hinesburg, VT (US); Nathan Jack, Forest Grove, OR (US); Souvick Mitra, Essex Junciton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/882,756

(22) Filed: Oct. 14, 2015

(65) Prior Publication Data
US 2016/0033564 A1    Feb. 4, 2016

Related U.S. Application Data

(62) Division of application No. 13/446,394, filed on Apr. 13, 2012, now Pat. No. 9,435,841.

(51) Int. Cl.
| | |
|---|---|
| *H02H 3/22* | (2006.01) |
| *G01R 31/00* | (2006.01) |
| *H02H 9/04* | (2006.01) |
| *G01R 31/28* | (2006.01) |
| *H01L 27/02* | (2006.01) |
| *H05K 9/00* | (2006.01) |

(52) U.S. Cl.
CPC ....... *G01R 31/002* (2013.01); *G01R 31/2851* (2013.01); *H02H 9/046* (2013.01); *H01L 27/0248* (2013.01); *H05K 9/0067* (2013.01)

(58) Field of Classification Search
CPC .. G01R 31/002; G01R 31/2851; H02H 9/046; H01L 27/0248; H05K 9/0067
USPC ..................................................... 361/56, 111
See application file for complete search history.

(56) References Cited

U.S. PATENT DOCUMENTS

| | | |
|---|---|---|
| 5,132,612 A | 7/1992 | Burns |
| 6,933,741 B2 | 8/2005 | Duvvury et al. |
| 7,119,597 B1 | 10/2006 | Barrett et al. |

(Continued)

OTHER PUBLICATIONS

IPCOM000064941D: "Tester for Electrostatic-Discharge Faults in Integrated Circuits" IBM TDB 09-85 p. 1791-1792.

(Continued)

*Primary Examiner* — Danny Nguyen
(74) *Attorney, Agent, or Firm* — L. Jeffrey Kelly (57) ABSTRACT

A method of protecting devices within an integrated circuit during electro-static discharge (ESD) testing using an ESD test system is provided. The method includes applying a direct current (DC) bias voltage to an input of at least one device of the integrated circuit and applying an ESD simulated signal to at least one other input of the integrated circuit. The applied ESD simulated signal is conducted along a first current path to a first ground, while a low-current signal associated with the at least one device is conducted along a second current path to the second ground. The DC bias voltage is maintained between the input of the at least one device and the second ground at a substantially constant value in response to a signal variation on the second ground that results from the applied ESD simulated signal.

7 Claims, 7 Drawing Sheets

(56) References Cited

U.S. PATENT DOCUMENTS

| | | | |
|---|---|---|---|
| 7,205,783 B2 | 4/2007 | Ito | |
| 7,928,753 B2 | 4/2011 | Fefer et al. | |
| 8,344,746 B2 | 1/2013 | Hernandez | |
| 2006/0262470 A1 | 11/2006 | Marum et al. | |
| 2007/0159205 A1* | 7/2007 | Grund | G01R 31/002 324/762.02 |
| 2009/0066354 A1 | 3/2009 | Gaertner | |
| 2009/0094568 A1 | 4/2009 | Shukla | |
| 2009/0134880 A1 | 5/2009 | Grund | |
| 2009/0134902 A1 | 5/2009 | Law | |
| 2010/0079160 A1 | 4/2010 | Hernandez et al. | |
| 2011/0286136 A1 | 11/2011 | Tsai | |
| 2013/0271883 A1 | 10/2013 | Chang et al. | |

OTHER PUBLICATIONS

IPCOM000114717D: "Micro Controller Program for Pseudo Random Electrostatic Discharge Pulse Generator" IBM TDB v38 n1 01-95 p. 431-434.

* cited by examiner

INTEGRATED CIRCUIT PROTECTION DURING HIGH-CURRENT ESD TESTING

BACKGROUND

The present invention relates generally to the electrostatic discharge (ESD) protection of integrated circuits, and more particularly, to providing protection during ESD testing of integrated circuits.

An electrostatic discharge (ESD) event may cause spurious or unwanted current spikes to flow through an integrated circuit. As a result, one or more devices within the integrated circuit may become damaged based on electrostatically discharged high current values (e.g., 1-10 A) causing dielectric (e.g., gate oxide breakdown) and/or metal (e.g., wire burn out) failure. As integrated circuit devices shrink in size, they may become more susceptible to ESD damage.

Integrated circuit manufacturers or other entities may engage in ESD testing in order to determine how resilient their integrated circuit devices are to ESD discharge events. Accordingly, it may be advantageous to protect the various devices within an integrated circuit during the ESD testing process.

SUMMARY

According to at least one exemplary embodiment, a method of protecting devices within an integrated circuit during electro-static discharge (ESD) testing using an ESD test system is provided. The method may include applying a direct current (DC) bias voltage to an input of at least one device of the integrated circuit and applying an ESD simulated signal to one other input of the integrated circuit. The applied ESD simulated signal is conducted along a first current path to a first ground, while a low-current signal associated with the at least one device is conducted along a second current path to the second ground. The DC bias voltage is maintained between the input of the at least one device and the second ground at a substantially constant value in response to a signal variation on the second ground that results from the applied ESD simulated signal.

According another exemplary embodiment, an electro-static discharge (ESD) test system operable to test the ESD capabilities of an integrated circuit is provided. The system may include a floating ground connection, a first plurality of switch devices, and a first plurality of contacts each operably coupled to the floating ground via a corresponding one of the first plurality of switch devices. The system may further include a second plurality of switch devices and a plurality of charge storage devices each having a first terminal and a second terminal, where the first terminal of each of the plurality of charge storage devices is operably coupled to the floating ground connection via a corresponding one of the second plurality of switch devices. Also provided is a second plurality of contacts that are each both operably coupled to one of the devices within the integrated circuit and coupled to the second terminal of a corresponding one of the plurality of charge storage devices. Each of the first plurality of contacts is coupled to a corresponding one of the second plurality of contacts and operable to provide a connection to the floating ground via a corresponding one of the first plurality of switch devices.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

According to exemplary embodiments described herein, one or more techniques may be utilized in order to protect an integrated circuit under test during ESD testing. ESD testing may include the application of ESD test waveforms to a location (e.g., a zap pad) on an integrated circuit device under test, and monitoring (e.g., sense/voltage pads) the occurrence of any device failures based on the resulting test waveforms. An ESD current test waveform may include a Human Body Model (HBM) waveform, which simulates a charged human body transferring its electrostatic charge to an ESD sensitive device (e.g., an integrated circuit). Another ESD current waveform may include a Machine Model (MM) waveform that simulates electrostatic charge discharged from a machine or tool. A Charged Device Model (CDM) waveform is yet another form of simulated ESD test signal that may be utilized during the ESD testing of integrated circuit devices. According to the exemplary embodiments described below, a Transmission Line Pulse (TLP) generator may be employed to provide ESD waveforms that are similar to HBM characteristics. A TLP test system may couple the generated ESD waveforms to a test location on an integrated circuit via a contact such as a zap pad, while one or more monitoring contacts such as sense/voltage pads may be used for both signal monitoring and the application of external DC bias voltages to the various components (e.g., gate of an NMOS transistor device) within the integrated circuit.

Figure 1:
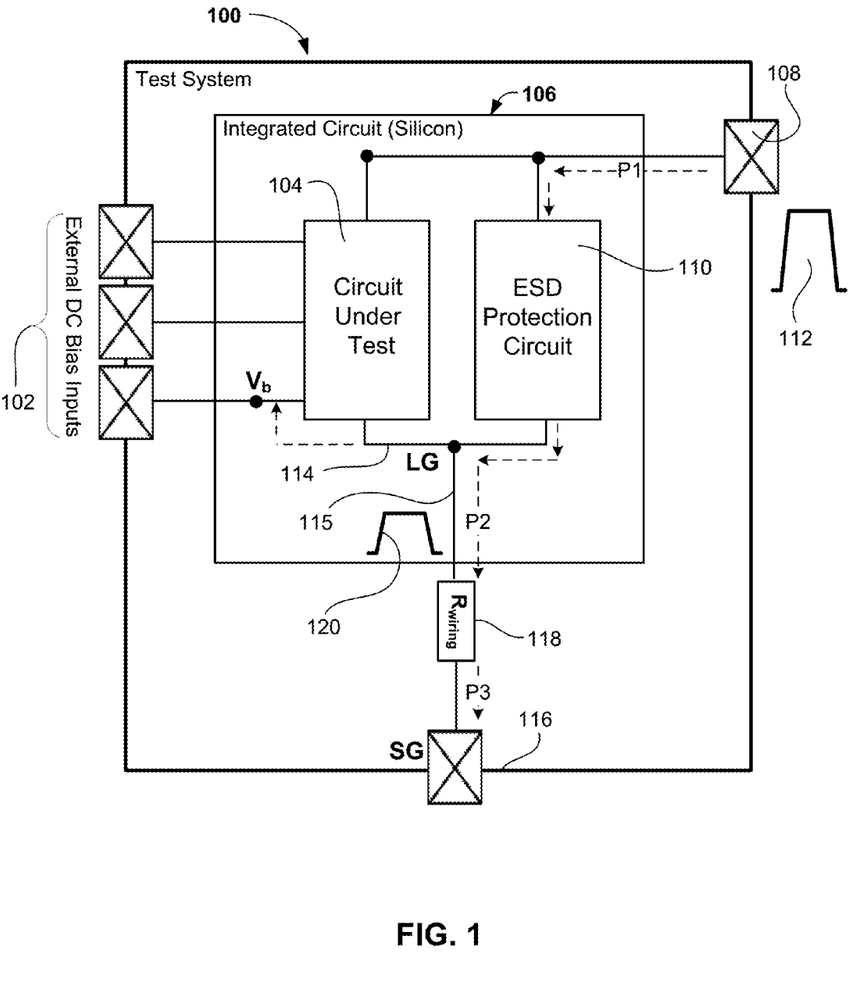
FIG. 1 is circuit block diagram of an electro-static discharge (ESD) test system according to known embodiments.

FIG. 1 refers to a circuit block diagram of an electro-static discharge (ESD) test system 100 according to a known embodiment. The test system 100 may include one or more external DC bias input 102 pads that are operable to provide DC voltages to one or more devices under test 104 (e.g., gate of a MOSFET device) within an integrated circuit 106. The application of DC bias voltages to the various device(s) under test 104 provides for the characterization of each device under different ESD conditions and applied DC bias voltages. For example, a device or circuit under test may exhibit different tolerances to applied ESD test waveforms based on the application of different DC bias voltages. Test system 100 may also include one or more input pads 108 for applying an ESD waveform generated by, for example, a TLP test system (not shown) to the one or more devices 104 and/or an ESD protection circuit 110 within the integrated circuit 106.

In operation, upon application of an ESD test waveform 112 to input pad 108, the ESD protection circuit 110 provides a discharge path along paths P1 and P2 to ground connection 114 of the integrated circuit 106, which is denoted as a silicon or local ground LG. The local ground LG of the integrated circuit 106 is also connected to the ground connection 116 of test system 100, which is denoted as system ground SG. As illustrated, a wiring resistance 118 exists in connection 115 between local ground LG and system ground SG. Although resistance values in conductors may be relatively small, they are capable of exhibiting various parasitic effects, an example of which is illustrated and described. Thus, as ESD test waveform 112 applied to input pad 108 is discharged along paths P1 and P2 to local ground connection LG, and further discharged through path P3 via connection 115 and wiring resistance 118 to system ground SG, a transient ground disturbance voltage 120 is generated at the local ground LG. The transient ground disturbance voltage 120 is produced as a result of the high current associated with the ESD test waveform 112 passing through the wiring resistance 118.

For example, an 8 A current associated with an ESD test waveform passing though a 0.5Ω wiring resistance generates a voltage disturbance of 4V at the local ground LG. This causes, for example, a DC biased (e.g., 1V DC) gate input of a device such as an NFET transistor (not shown) to have its ground raised by the 4V transient ground disturbance, which in turn reverse biases the NFET oxide interface by 3V (i.e., 1V−4V=−3V). Excessive forward or reverse bias voltages that are generated in this manner may be sufficient to cause permanent damage to devices under test. Such ground voltage disturbances and corresponding exemplary compensatory measures are illustrated and described in relation to the embodiments of FIG. 2-4.

Figure 2:
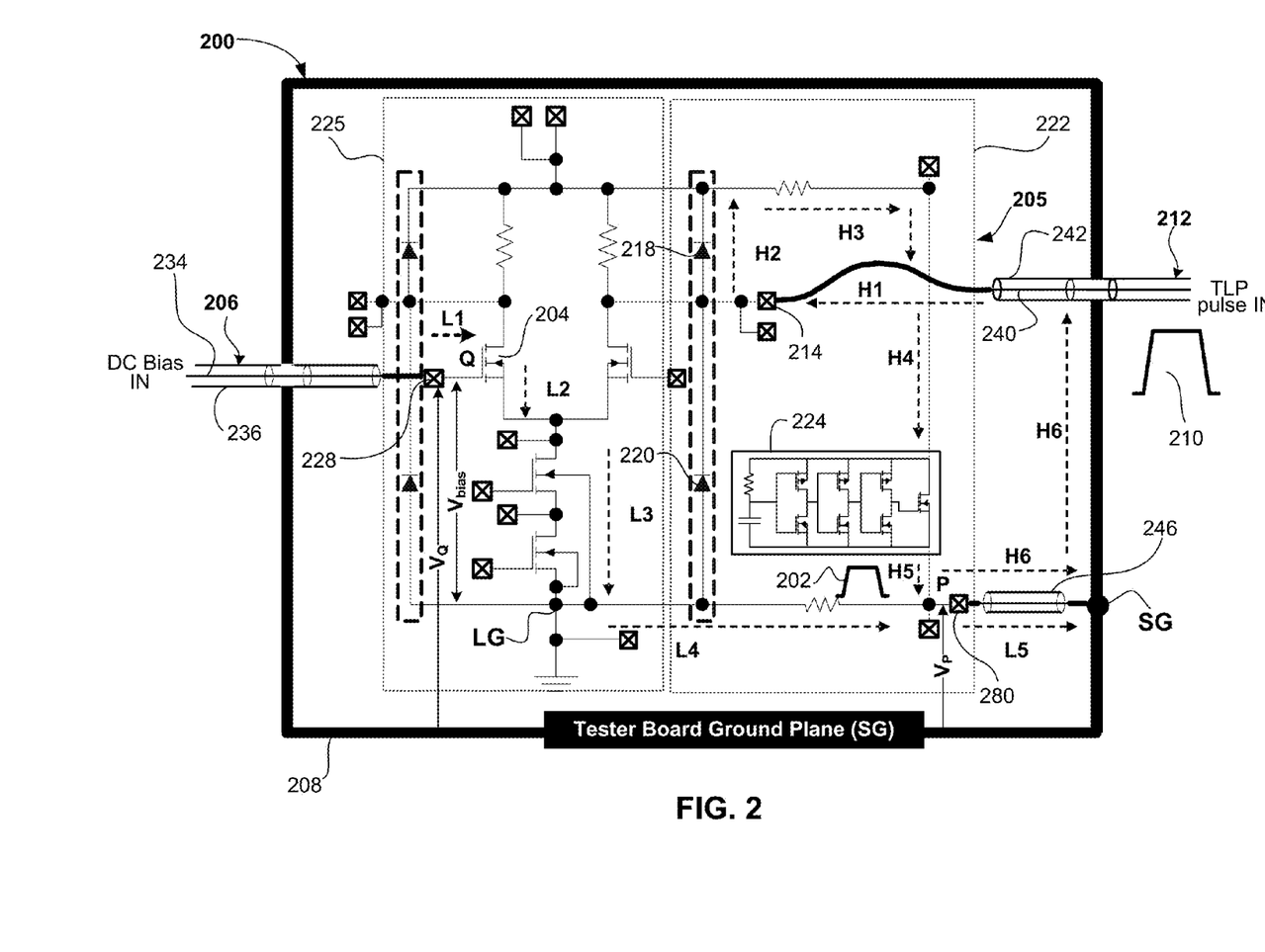
FIG. 2 is a schematic diagram of an electro-static discharge (ESD) test system according to known embodiments.

FIG. 2 refers to a schematic diagram of an electro-static discharge (ESD) test system 200 according to a known embodiment. FIG. 2 illustrates an example of how a generated transient ground disturbance signal 202 may cause damage to a device under test (DUT) 204 that is associated with an integrated circuit 205. Although for brevity the DUT is identified as device 204, according to one or more other example configurations, a DUT may include the entire, or any portion of, integrated circuit 205, whereby the integrated circuit 205 incorporates an ESD protection circuit 222 and protected circuit 225. The test portion of the system 200 may include one or more external DC voltage sources (not shown) that may provide DC bias voltages to the device under test 204 via, for example, a coaxial cable 206. The test portion of the system may further include a test system ground plane 208 and a TLP pulse generator (not shown) that is operable to generate simulated ESD signals 210 via, for example, a coaxial cable 212 to a test input (e.g., zap pad) 214 of the integrated circuit 205. The tested integrated circuit 205 of the system 200 may include an ESD protection device 222 having a diode network or diode-pair 218 and 220, and a power clamp circuit 224, such that diode 218 operably conducts a positive ESD pulse to the power clamp circuit 224. Upon the power clamp circuit 224 receiving the positive ESD pulse, the power clamp circuit 224 conducts the positive ESD pulse to the integrated circuit's ground, which is denoted as silicon ground or Local Ground LG, and then to system ground SG through pad 280. Similarly, diode 220 operably conducts a negative ESD pulse to the power clamp circuit 224, where the power clamp circuit 224 also conducts the negative ESD pulse via the integrated circuit's ground LG to system ground SG.

The nFET device (i.e., an example DUT) 204 is DC biased via pad 228 at its gate input Q. In order to facilitate the DC biasing of the DUT 204, an external DC voltage source (not shown) is connected to the pad 228 via, for example, a coaxial cable 206. The center conductor 234 of the coaxial cable 206 is connected to pad 228, while the outer conductor (i.e., shield) 236 is connected to the system ground SG. The TLP pulse generator (not shown) generates the ESD signal 210, which is provided to test pad 214 via coaxial cable 212. The center conductor 240 of the coaxial cable 212 is connected to pad 214, while the outer conductor (i.e., shield) 242 is also connected to system ground SG.

In operation, the TLP pulse generator (not shown) generates the ESD pulse signal 210, which is applied to the test pad 214 along signal path H1. Upon receiving the ESD pulse signal 210 at pad 214, diode 218 is forward biased and conducts the ESD pulse signal 210 along path H2 to paths H3 and H4. As the ESD pulse signal is received by the power clamp circuit 224 along path H4, the ESD pulse signal is further conducted through the power clamp circuit 224 to local ground LG and pad 280 along path H5. The ESD pulse signal is then conducted along path H6 to system ground SG via wiring connection 246. The current paths (i.e., H1-H6) propagated by the ESD pulse signal are the high-current path. Since the ESD pulse signal is a high-current signal, as the high-current ESD pulse signal passes through the wiring connection 246, a voltage drop occurs across the wiring connection 246 as a result of a finite wiring resistance associated with the connection 246. Thus, based on the occurrence of the voltage drop across the wiring connection 246, the transient ground disturbance signal 202 is generated between the local LG and system SG grounds, as denoted by voltage $V_P$, located at point P.

As the DC bias voltage is applied to input pad 228 via cable 206, the gate of the nFET device 204 is DC biased relative to the system ground SG, as denoted by $V_Q$, located at point Q. As the gate of the nFET device under test 204 turns on as a result of the applied DC bias, a low-current path is traversed along paths L1, L2, and L3 to the local ground LG. The low current signal then passes along path L4 on the local ground LG and shares a portion of the high-current path (i.e., H6) at path L5.

Under normal operating conditions, since the system ground SG of the test system and the local ground LG are connected, the bias voltage between the gate of DUT 204 and local ground LG, as denoted by $V_{bias}$, is equivalent to the applied DC bias voltage denoted by $V_Q$. However, when the transient ground disturbance signal 202 is generated between the local LG and system SG grounds, the resultant voltage ($V_P$) raises the voltage level of the local ground LG relative to the system SG ground.

The actual bias voltage, as seen by the gate of the device 204, is given by:

$$V_{bias} = V_Q - V_P \qquad \text{Equation (1)}$$

For example, if the transient ground disturbance signal 202 generates a voltage of $V_P$=+4V and the applied DC bias voltage has a value of $V_Q$=+1 v, according to Equation (1) above, the DC bias voltage will have a value of $V_{bias}$=−3 v. This negative bias value of −3 v DC may cause permanent damage (e.g., gate oxide breakdown) to the DUT 204 when evaluated under ESD test conditions based on the raised voltage (e.g., $V_P$=+4 v) that occurs on the local ground LG of the integrated circuit 205.

Figure 3:
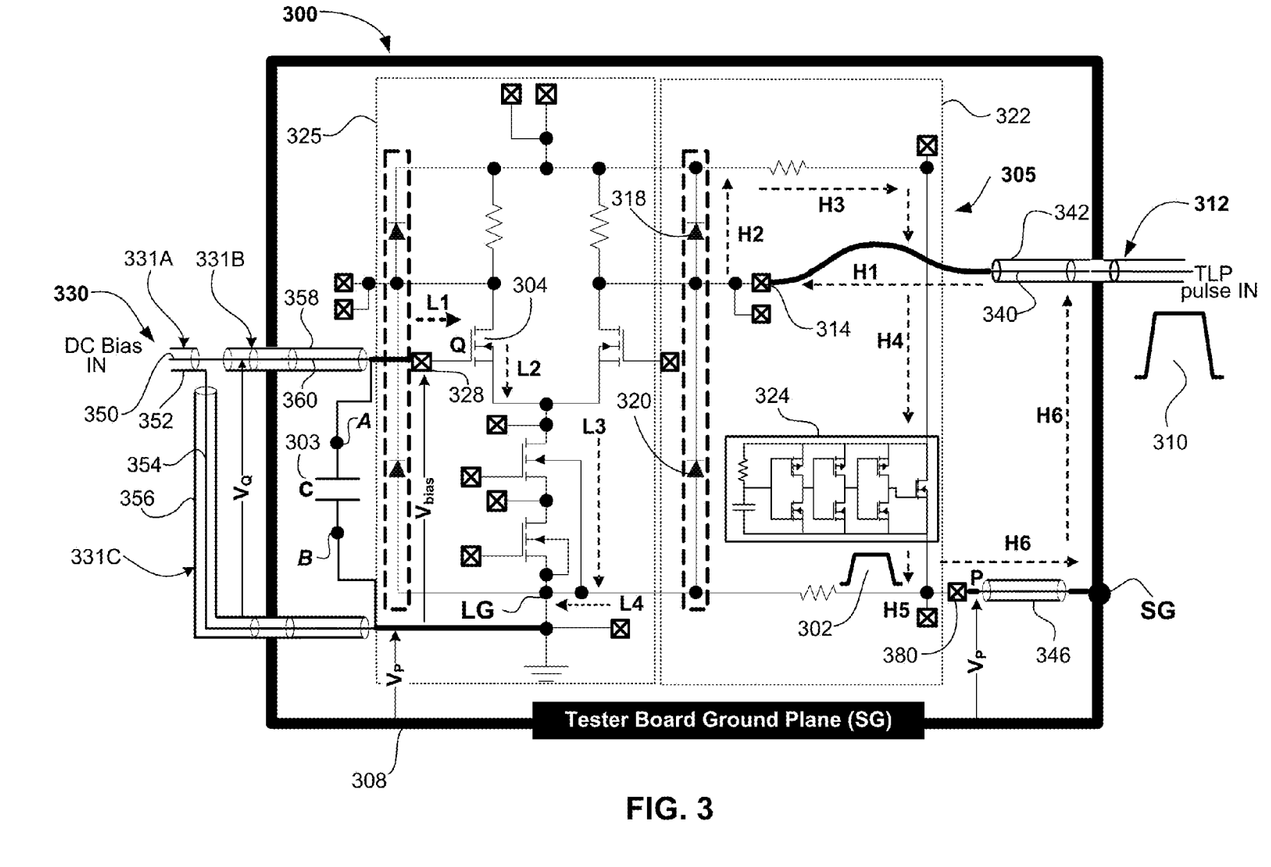
FIG. 3 is a schematic diagram of an electro-static discharge (ESD) test system that compensates for the occurrence of unwanted ground disturbance signals during ESD testing, according to one embodiment.

In accordance with one embodiment, FIG. 3 refers to a schematic diagram of an electro-static discharge (ESD) test system 300 that compensates for the occurrence of unwanted ground disturbance signals that may occur during ESD testing. The electro-static discharge (ESD) test system 300 differs from test system 200 (FIG. 2) in that a charge storage device such as a capacitor 303 is coupled between the DC bias input to DUT 304 and the local ground LG (also referred to as silicon ground) of integrated circuit 305. Also, an external DC voltage source (not shown) is connected to test pad 328 via, for example, a modified coaxial cable 330, which includes cable sections 331A, 331B, and 331C. The center conductor 350 of cable section 331A is connected to test pad 328 via center conductor 360 of cable section 331B. The outer conductor 352 (i.e., shield) of cable section 331A is broken out and connected to the center conductor 354 of cable section 331C, whereby center conductor 354 is coupled to the local ground LG of circuit 325. Outer conductors 358 and 356 of cable sections 331B and 331C, respectively, are connected to the system ground SG. Thus, the DC voltage source is operable to provide a DC voltage to the gate of the DUT 304 via pad 328 by connecting the DC source voltage output to center conductor 360 of cable section 331B and connecting the DC source ground to center conductor 354 of cable section 331C.

FIG. 3 shows an example of how a generated transient ground disturbance signal 302 that may cause damage to device 304 of circuit 325 is compensated or prevented. The test portion of the system 300 may include one or more external DC voltage sources (not shown) that may provide DC bias voltages to the device under test 304 via, for example, the modified coaxial cable 330. The test portion of the system may further include a test system ground plane 308 and a TLP pulse generator (not shown) that is operable to generate simulated ESD signals 310 via, for example, a coaxial cable 312 to a test input (e.g., zap pad) 314 of the integrated circuit 305. The tested integrated circuit 305 of the system 300 may include an ESD protection device 322 having a diode network or diode-pair 318 and 320, and a power clamp circuit 324, such that diode 318 operably conducts a positive ESD pulse to the power clamp circuit 324. Upon the power clamp circuit 324 receiving the positive ESD pulse, the power clamp circuit 324 conducts the positive ESD pulse to the integrated circuit's ground LG. The integrated circuit 305 of the system 300 may also include one or more devices and circuits 325 (i.e., including DUT 304) within the integrated circuit 305, which are tested for evaluating their resilience under simulated ESD conditions. Although for brevity the DUT is identified as device 304, according to one or more other example configurations, a DUT may include the entire, or any portion of, integrated circuit 305, whereby the integrated circuit 305 incorporates an ESD protection circuit 322 and protected circuit 325.

The nFET device 304 is DC biased via pad 328 at its gate input Q using the external DC voltage source and cable 330 in the manner explained above. The TLP pulse generator (not shown) generates the ESD signal 310, which is provided to test pad 314 via coaxial cable 312. The center conductor 340 of the coaxial cable 312 is connected to pad 314, while the outer conductor (i.e., shield) 342 is coupled to system ground SG.

In operation, the TLP pulse generator (not shown) generates the ESD pulse signal 310, which is applied to the test pad 314 along signal path H1. Upon receiving the ESD pulse signal 310 at pad 314, diode 318 is forward biased and conducts the ESD pulse signal 310 along path H2 to paths H3 and H4. As the ESD pulse signal is received by the power clamp circuit 324 along path H4, the ESD pulse signal is further conducted through the power clamp circuit 324 to local ground LG and pad 380 along path H5. The ESD pulse signal is then conducted along path H6 to system ground SG via wiring connection 346. The current paths (i.e., H1-H6) propagated by the ESD pulse signal are the high-current path. Since the ESD pulse signal 310 is a high-current signal, as the high-current ESD pulse signal passes through the wiring connection 346, as previously described, a voltage drop occurs across the wiring connection 346 as a result of a finite wiring resistance associated with the connection 346. Thus, based on the occurrence of the voltage drop across the wiring connection 346, the transient ground disturbance signal 302 is generated between the local LG and system SG grounds, as denoted by voltage $V_P$, located at point P.

As the DC bias voltage is applied to input pad 328 via cable 330, the gate of the nFET device 304 (i.e., an example DUT) is DC biased relative to the local ground LG, as denoted by $V_Q$, located at point Q. As the gate of the nFET device under test 304 turns on as a result of the applied DC bias, a low-current path is traversed along paths L1, L2, and L3 to the local ground LG. In the current exemplary embodiment, the low current signal then passes along path L4 on the local ground LG back to the voltage source ground such that the low-current path (i.e., L1-L4) is separate from the high-current path (i.e., H1-H6).

Under normal operating conditions, the bias voltage between the gate of device 304 and local ground LG, as denoted by $V_{bias}$, is equivalent to the applied DC bias voltage denoted by $V_Q$. Moreover, when the transient ground disturbance signal 302 is generated between the local LG and system SG grounds, the resultant voltage ($V_P$) raises the voltage level of the local ground LG relative to the system SG ground. However, due to the DC biasing being implemented with respect to the local ground LG, any voltage level increase ($V_P$) caused by the transient ground disturbance signal 302 on the local ground LG, also raises the voltage output from the DC voltage source. This is due to the DC voltage value being referenced to the local ground LG, which experiences the transient voltage disturbances caused under ESD pulse conditions.

The actual bias voltage, as seen by the gate of device 304, is given by:

$$V_{bias} = V_Q - V_{LG} \quad \text{Equation (2)}$$

Under normal operating conditions where there is no voltage disturbance on the local ground LG, the local ground voltage with be $V_{LG}=0$ v. Thus:

$$V_{bias} = V_Q \quad \text{Equation (3)}$$

However, the transient ground disturbance signal 302 on the local ground LG (i.e., when: $V_{LG}=V_P$) will also raise the ground reference of the DC voltage source, which in turn will raise the DC voltage at the device 302 gate, and, thus maintain the applied DC bias voltage ($V_{bias}$) at the gate of the device 304 at a constant value. This is illustrated below, where:

$$V_{bias} = (V_Q + V_P) - (V_{LG} = V_P) \quad \text{Equation (4)}$$

$$V_{bias} = V_Q + V_P - V_P \quad \text{Equation (5)}$$

$$V_{bias} = V_Q \quad \text{Equation (6)}$$

As shown, the modified cable 330 connection generally maintains the DC bias at the device 304 input during biasing. However, the raised voltage on the local ground LG due to the transient signal 302 has to propagate along cable sections 331C and 331A to the DC voltage source in order for the DC voltage source to detect the change in ground reference voltage, and accordingly generate a corresponding change in the bias voltage that is applied to the device 304 via cable sections 331A and 331B. Due to the effect of this propagation delay, the gate of the device 304 may still experience a momentary change in DC bias voltage based on the ground disturbance voltage. In order to compensate for the propagation delay effect, the capacitor device 303 is utilized. The capacitor 303 acts as a charge storage device for DC signals applied to the device 304 input (e.g., gate). Therefore, the applied bias voltage ($V_{bias}$) is maintained at a constant value (i.e., $V_{bias}$) at the charged capacitor terminal A.

Alternatively, the capacitor 303 acts as a short circuit for high-frequency signals such as the transient ground disturbance signal 302, which has a pulse period equivalent to that of the ESD pulse signal. Consequently, as a result of the capacitor 303 acting as a short circuit with respect to the transient ground disturbance signal 302 on the local ground LG, the transient ground disturbance signal 302 at terminal B of the capacitor 303 also appears at terminal A of the capacitor. Thus, since both the gate of the device 304 and the local ground LG see the same disturbance, the voltage difference between the gate of the DUT 304 and the local ground LG remains zero. Thus, the capacitor 303 holds constant the DC bias voltage applied by the DUT 304 via the voltage source, while eradicating the effect the transient signal 302 caused by the ESD pulse 310 on the local ground LG.

The embodiment of FIG. 3 provides two compensatory mechanisms, where the modified cable 330 maintains the constant DC bias applied to the DUT 304 for any DC or long period pulses that may occur on the local ground LG, while the capacitor 303 maintains the constant DC bias applied to the DUT 304 for any short transient pulses such as the occurrence of transient disturbance signal 302 on the local ground LG. This dual compensatory mechanism is provided as a result of the separation between the high-current path (i.e., H1-H6) and the low-current path (i.e., L1-L4).

Figure 4:
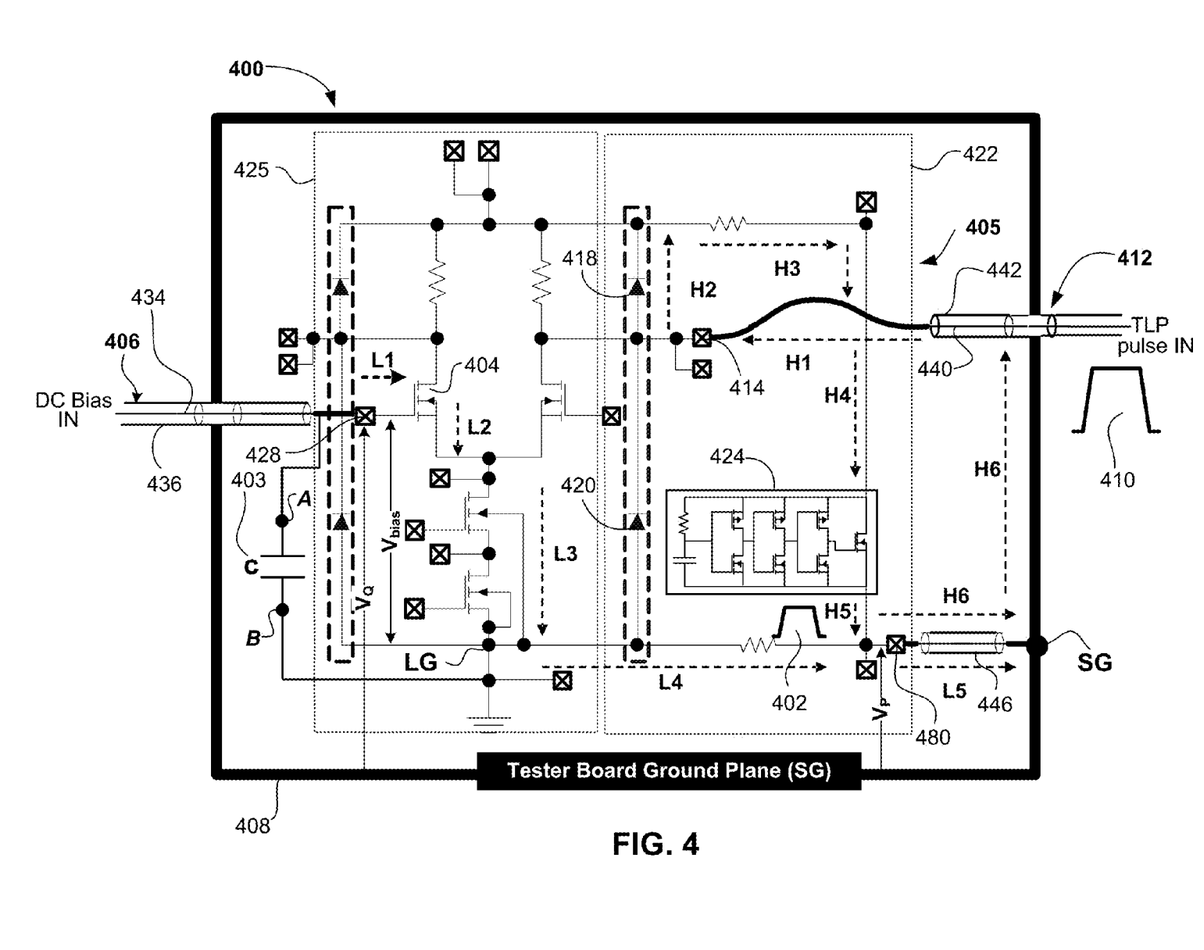
FIG. 4 is a schematic diagram of an electro-static discharge (ESD) test system that compensates for the occurrence of unwanted ground disturbance signals during ESD testing, according to another embodiment.

In accordance with another embodiment, FIG. 4 refers to a schematic diagram of another electro-static discharge (ESD) test system 400 that compensates for the occurrence of unwanted ground disturbance signals that may occur during ESD testing. The electro-static discharge (ESD) test system 400 differs from test system 200 (FIG. 2) in that a charge storage device such as a capacitor 403 is coupled between the DC bias input to device 404 and the local ground LG (also referred to as silicon ground) of integrated circuit 405. Although for brevity the DUT is identified as device 404, according to one or more other example configurations, a DUT may include the entire, or any portion of, integrated circuit 405, whereby the integrated circuit 405 incorporates an ESD protection circuit 422 and protected circuit 425. The test portion of the system 400 may include one or more external DC voltage sources (not shown) that may provide DC bias voltages to the device 404 via, for example, a coaxial cable 406. The test portion of the system may further include a test system ground plane 408 and a TLP pulse generator (not shown) that is operable to generate simulated ESD signals 410 via, for example, a coaxial cable 412 to a test input (e.g., zap pad) 414 of the integrated circuit 405. As previously described, the tested integrated circuit 405 of the system 400 includes an ESD protection device 422 having a diode network or diode-pair 418 and 420, and a power clamp circuit 424, such that diode 418 operably conducts a positive ESD pulse to the power clamp circuit 424. Upon the power clamp circuit 424 receiving the positive ESD pulse, the power clamp circuit 424 conducts the positive ESD pulse to the integrated circuit's ground, which is denoted as Local Ground LG, and then to system ground SG through pad 480. Similarly, diode 420 operably conducts a negative ESD pulse to the power clamp circuit 424, where the power clamp circuit 424 also conducts the negative ESD pulse via the integrated circuit's ground LG to system ground SG.

The nFET device 404 (i.e., an example DUT) is DC biased via pad 428 at its gate input Q. In order to facilitate the DC biasing of the DUT 404, an external DC voltage source (not shown) is connected to the pad 428 via, for example, a coaxial cable 403. The center conductor 434 of the coaxial cable 403 is connected to pad 428, while the outer conductor (i.e., shield) 436 is connected to the system ground SG. The TLP pulse generator (not shown) generates the ESD signal 410, which is provided to test pad 414 via coaxial cable 412. The center conductor 440 of the coaxial cable 412 is connected to pad 414, while the outer conductor (i.e., shield) 442 is also connected to system ground SG.

In operation, the TLP pulse generator (not shown) generates the ESD pulse signal 410, which is applied to the test pad 414 along signal path H1. Upon receiving the ESD pulse signal 410 at pad 414, diode 418 is forward biased and conducts the ESD pulse signal 410 along path H2 to paths H3 and H4. As the ESD pulse signal is received by the power clamp circuit 424 along path H4, the ESD pulse signal is further conducted through the power clamp circuit 424 to local ground LG and pad 480 along path H5. The ESD pulse signal is then conducted along path H6 to system ground SG via wiring connection 446. The current paths (i.e., H1-H6) propagated by the ESD pulse signal are the high-current path. Since the ESD pulse signal is a high-current signal, as the high-current ESD pulse signal passes through the wiring connection 446, a voltage drop occurs across the wiring connection 446 as a result of a finite wiring resistance associated with the connection 446. Thus, based on the occurrence of the voltage drop across the wiring connection 446, the transient ground disturbance signal 402 is generated between the local LG and system SG grounds, as denoted by voltage $V_P$, located at point P.

As the DC bias voltage is applied to input pad 428 via cable 406, the gate of the nFET device 404 is DC biased relative to the system ground SG, as denoted by $V_Q$, located at point Q. As the gate of the nFET device under test 404 turns on as a result of the applied DC bias, a low-current path is traversed along paths L1, L2, and L3 to the local ground LG. The low current signal then passes along path L4 on the local ground LG and shares a portion of the high-current path (i.e., H6) at path L5.

Under normal operating conditions, since the system ground SG of the test system and the local ground LG are connected, the bias voltage between the gate of DUT 404 and local ground LG, as denoted by $V_{bias}$, is equivalent to the applied DC bias voltage denoted by $V_Q$. However, when the transient ground disturbance signal 402 is generated between the local LG and system SG grounds, the resultant voltage ($V_P$) raises the voltage level of the local ground LG relative to the system SG ground. This transient ground disturbance signal 402 generated between the local LG and system SG ground is, however, compensated by the capacitor 403, where capacitor 403 acts as a charge storage device for DC signals applied to the DUT 404 input (e.g., gate). Therefore, the applied bias voltage ($V_{bias}$) of the DUT 404 is maintained at a constant value (i.e., $V_{bias}$) at the charged capacitor terminal A.

Capacitor 403, however, acts as a short circuit for high-frequency signals such as the generated transient ground disturbance signal 402, which has a pulse period equivalent to that of the ESD pulse signal. Consequently, as a result of the capacitor 403 acting as a short circuit with respect to the transient ground disturbance signal 402 on the local ground LG, the transient ground disturbance signal 402 at terminal B of the capacitor 403 also appears at terminal A of the capacitor. Thus, since both the gate of the device 404 and the local ground LG see the same disturbance, the voltage difference between the gate of the device 404 and the local ground LG remains zero. Thus, the capacitor 403 holds constant the DC bias voltage applied by the device 304 via the voltage source, while eliminating the effect the transient signal 402 caused by the ESD pulse 410 on the local ground LG.

The Capacitor 403 may include a value in the range of approximately 1-100 nano-Farads (nF). While the embodiment of FIG. 4 compensates for transient ESD generated pulses on the local ground LG of the integrated circuit devices under test, it may not compensate for DC or long pulses that may occur on the local ground. Due to this embodiment (FIG. 4) not having a modified DC bias cable connection arrangement, as provided in the embodiment of FIG. 3, it may be simpler to implement in an automated ESD test system (see FIG. 6). Capacitor 303 (FIG. 3) may also include a value in the range of approximately 1-100 nano-Farads (nF). Both capacitors 303, 403 may contemplate the use of capacitors over the value of 100 nF, although in some instances the use of larger capacitor values may not provide any operational advantages. As previously described, the capacitors act as: (1) a DC signal storage device operable to charge up to and hold the DC bias voltage that is applied to the DUT input (e.g., gate) by the external voltage source; and (2) a short circuit to transient ground signals for maintaining the same potential difference between the two terminals of the capacitor, which are coupled between the input (e.g., gate) of the DUT (e.g., MOSFET) and the local ground LG of the integrated circuit associated with the DUT.

The actual bias voltage, as seen by the gate of the device 404, is given by:

$$V_{bias} = V_Q - V_{LG} \qquad \text{Equation (7)}$$

Under normal operating conditions where there is no voltage disturbance on the local ground LG, the local ground voltage with be $V_{LG}=0$ v. Thus:

$$V_{bias} = V_Q \qquad \text{Equation (8)}$$

Under a ground disturbance scenario, however, due to capacitor 403, the transient ground disturbance signal 402 on the local ground LG (i.e., when: $V_{LG}=V_P$) will also appear at the DUT 402 gate as result of the capacitor 403 acting as a short circuit to this high frequency transient ground disturbance signal 402. Thus, the applied DC bias voltage ($V_{bias}$) between local ground LG and the gate of the DUT 404 remains constant, and held at the provided DC bias value stored on terminal A by the capacitor 403. This is illustrated below, where:

$$V_{bias} = (V_Q + V_P) - (V_{LG} = V_P) \qquad \text{Equation (9)}$$

$$V_{bias} = V_Q + V_P - V_P \qquad \text{Equation (10)}$$

$$V_{bias} = V_Q = V_{ExternalBias} \qquad \text{Equation (11)}$$

Figure 5:
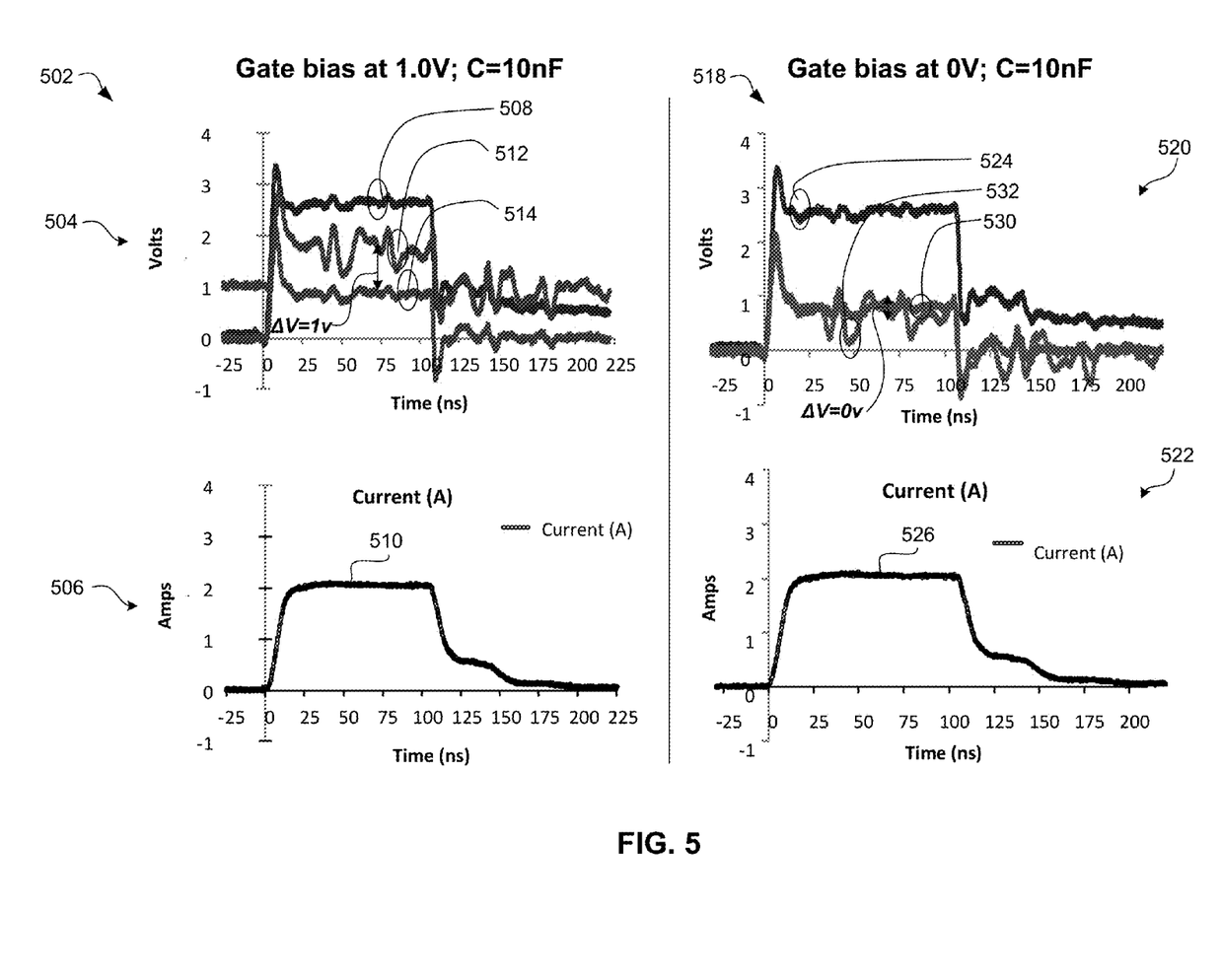
FIG. 5 illustrates experimental results associated with the operation of the ESD test system of the embodiment of FIG. 4.

FIG. 5 refers to measured results obtained using the exemplary embodiment of FIG. 4. Graphs 502 refer to a measured voltage graph 504 and measured current graph 506 when the device 404 gate voltage ($V_Q$) is externally DC biased at +1 v. As illustrated, the measured voltage graph 504 includes a simulated electro-static discharge (ESD) input signal 508 from a TLP pulse generator of about 2.7 v, which has a pulse period of approximately 100 nanoseconds (ns). The simulated electro-static discharge (ESD) input signal 508 generates a corresponding 100 ns current pulse 510 of approximately 2 A. The value of the capacitor 403 (FIG. 4) was chosen as 10 nF during measurements.

As the simulated electro-static discharge (ESD) test input signal 508 is applied, a ground disturbance signal 514 on local ground LG (FIG. 4) caused by the simulated electro-static discharge (ESD) test input signal 508 is detected and measured. The measured ground disturbance signal 514 is a transient 100 ns pulse that raises the ground potential from about 0 v to approximately 1 v. Due to the capacitor 403 (FIG. 4) acting as a short circuit with respect to the ground disturbance signal 514 being received at terminal B, the voltage signal 512 at the gate of the device 404 (FIG. 4) is also raised by the same voltage as the ground disturbance signal 514. Thus, the net voltage potential between the gate of the device 404 (FIG. 4) and local ground LG (FIG. 4) remains unchanged despite the occurrence of the ground disturbance signal 514. As denoted by ΔV on graph 504, the DC bias voltage between the local ground LG and gate remains at the applied+1 v value during the ground disturbance caused by ground signal 514.

The graphs depicted by 518 refer to a measured voltage graph 520 and measured current graph 522 when the DUT device 404 gate voltage ($V_Q$) is DC biased at 0 v. As with the previous measurements, the measured voltage graph 520 includes a simulated ESD input signal 524 from a TLP pulse generator of about 2.7 v, which has a pulse period of approximately 100 nanoseconds (ns). The simulated ESD input signal 508 generates a corresponding 100 ns current pulse 526 of approximately 2 A. The value of the capacitor 403 (FIG. 4) was also chosen as 10 nF.

As the simulated ESD test input signal 524 is applied, a ground disturbance signal 530 on local ground LG (FIG. 4) caused by the simulated ESD test input signal 524 is detected and measured. The measured ground disturbance signal 530 is also a transient 100 ns pulse that raises the ground potential from about 0 v to approximately 1 v. Due to the capacitor 403 (FIG. 4) acting as a short circuit with respect to the ground disturbance signal 530 being received at terminal B, the voltage signal 532 (i.e., DC biased at 0 v) at the gate of the device 404 (FIG. 4) is also raised by the same voltage as the ground disturbance signal 530. Thus, the net voltage potential between the gate of the device 404 (FIG. 4) and local ground LG (FIG. 4) remains unchanged despite the occurrence of the ground disturbance signal 530. As denoted by ΔV on graph 520, the DC bias voltage between the local ground LG and gate remains at the applied 0V value.

Figure 6:
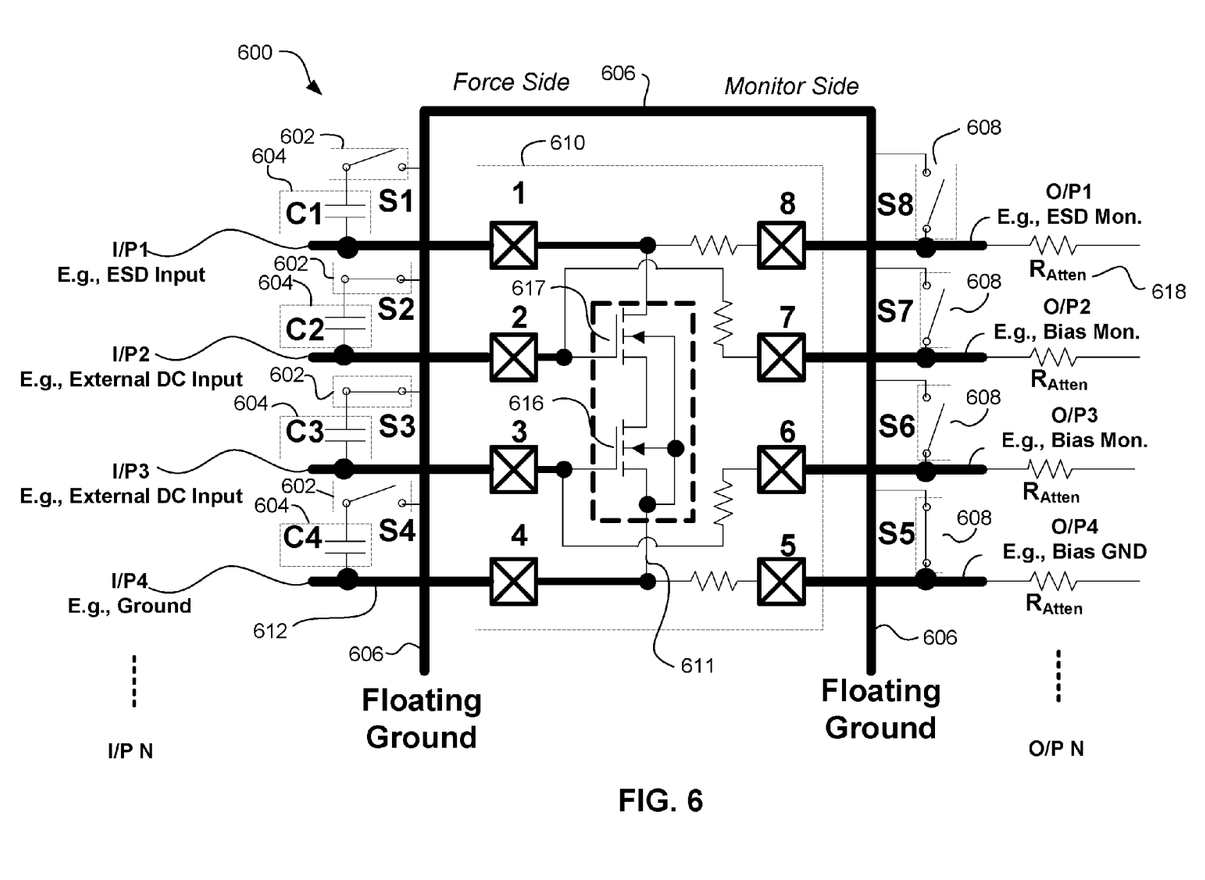
FIG. 6 is schematic diagram of an automated electro-static discharge (ESD) test system according to one embodiment.

FIG. 6 refers to an automated electro-static discharge (ESD) test system 600 according to one embodiment. Automated test system 600 may include a first plurality or bank of switches 602, a plurality or bank of capacitors 604 associated with the first plurality of switches 602, a floating ground plane connection 606, and a second plurality or bank of switches 608 associated with the floating ground plane 606. Each of the plurality or bank of capacitors 604 (C1-C4) may compensate for transient pulses occurring on the local ground by utilizing the same operating principles as those described in relation to the embodiment of FIG. 4. FIG. 6 illustrates an automated system that compensates for local ground transient pulses for multiple DC biased devices or circuits under simulated ESD test conditions.

The first plurality or bank of switches 602 and their corresponding plurality or bank of capacitors 604 constitute the force side of the automated system, where an example integrated circuit 610 under test receives input stimuli such as one or more external DC biasing and simulated ESD signals from a TLP pulse generator. The force side of the automated system 600 also includes a ground input 612 associated with the ground of the TLP pulse generator providing the simulated ESD signal to the integrated circuit 610 being tested. Although for brevity the force side is shown with four inputs, up to twenty-five or more force side inputs and up to twenty-five or more monitor/sense side outputs may be contemplated. Each of the plurality or bank of capacitors 604 (C1-C4) are connected between a corresponding one of the first plurality or bank of switches 602 (i.e., S1-S4) and inputs I/P1-I/P4. For example, capacitor C1 is connected between I/P1 and Switch S1, capacitor C2 is connected between I/P2 and Switch S2, capacitor C3 is connected between I/P3 and Switch S3, and capacitor C4 is connected between I/P4 and Switch S4.

In operation, for example, if an external bias is applied to I/P3, switch S3 is actuated to the closed position so that the capacitor C3 couples the DC biased input (e.g., gate) of the device 616 (e.g., MOSFET) under test to local ground 611 via the floating ground connection 606. Similarly, for example, if an external bias is also applied to I/P2, switch S2 is actuated to the closed position so that the capacitor C2 couples the DC biased input (e.g., gate) of the device 617 (e.g., MOSFET) under test to local ground 611 via the floating ground connection 606. Designated ground input 612 (i.e., I/P4) is connected to the floating ground 606 of the tester 600 by closing switch S5. Using the same described principles as those referred to in relation to FIG. 4, capacitors C2 and C3 compensate for and, thus, establish a constant DC bias voltage at the inputs (e.g., gate) of devices 617 and 616, respectively, during any occurrence of transient ground disturbance signals that may be generated during the application of ESD pulses during ESD testing.

Also during operation, for example, a TLP pulse generator (not shown) may be connected between force input I/P1 and the designated ground input I/P4. For both inputs I/P1 and I/P4, switches S1 and S4 are in the open configuration since the capacitors (i.e., C1 and C4) are not being used in connection with protecting the biased inputs of the one or more devices (e.g., MOSFETs 616 and 617) under test within integrated circuit 610. Further, in order to establish the high current ground path for the ESD input I/P1, I/P4, as the designated ground connection, is connected to the ground plane 606 by closing switch S5. During this exemplary configuration of the test system 600, by closing switch S5, the test system ground associated with the TLP pulse generation system is coupled to the local or silicon ground 611 of the integrated circuit 610 via the floating ground 606.

On the sense/monitoring side, the TLP pulse that is generated may be monitored at O/P1 by maintaining switch S8 in the open position Also, on the sense side, the DC biased input (e.g., gate) of the device 616 (e.g., MOSFET) under test is monitored between O/P3 by maintaining switch S6 in the open position, and O/P4 which establishes the connection to the local ground 611. Further, the DC biased input (e.g., gate) of device 617 (e.g., MOSFET) is also monitored between O/P2 by maintaining switch S7 in the open position, and O/P4 which establishes the connection to the local ground 611. As shown on the sense side, attenuation resistors $R_{Atten}$ may be included to avoid damaging the input circuitry of monitoring equipment such as oscilloscopes, frequency analyzers, etc. For example, an attenuation resistor 618 may be utilized to attenuate the generated TLP pulse signal being monitored at O/P1.

The automated test system 600 embodiment depicted in FIG. 6 operates to provide DUT protection under multiple DC bias conditions for both the embodiments 300, 400 depicted in FIGS. 3 and 4, respectively. The test system may be configured to test any integrated circuit by selectively assigning the test system inputs (e.g., bias input(s), TLP input, etc.) and accordingly configuring the position (e.g., open/closed) of the switches.

Figure 7:
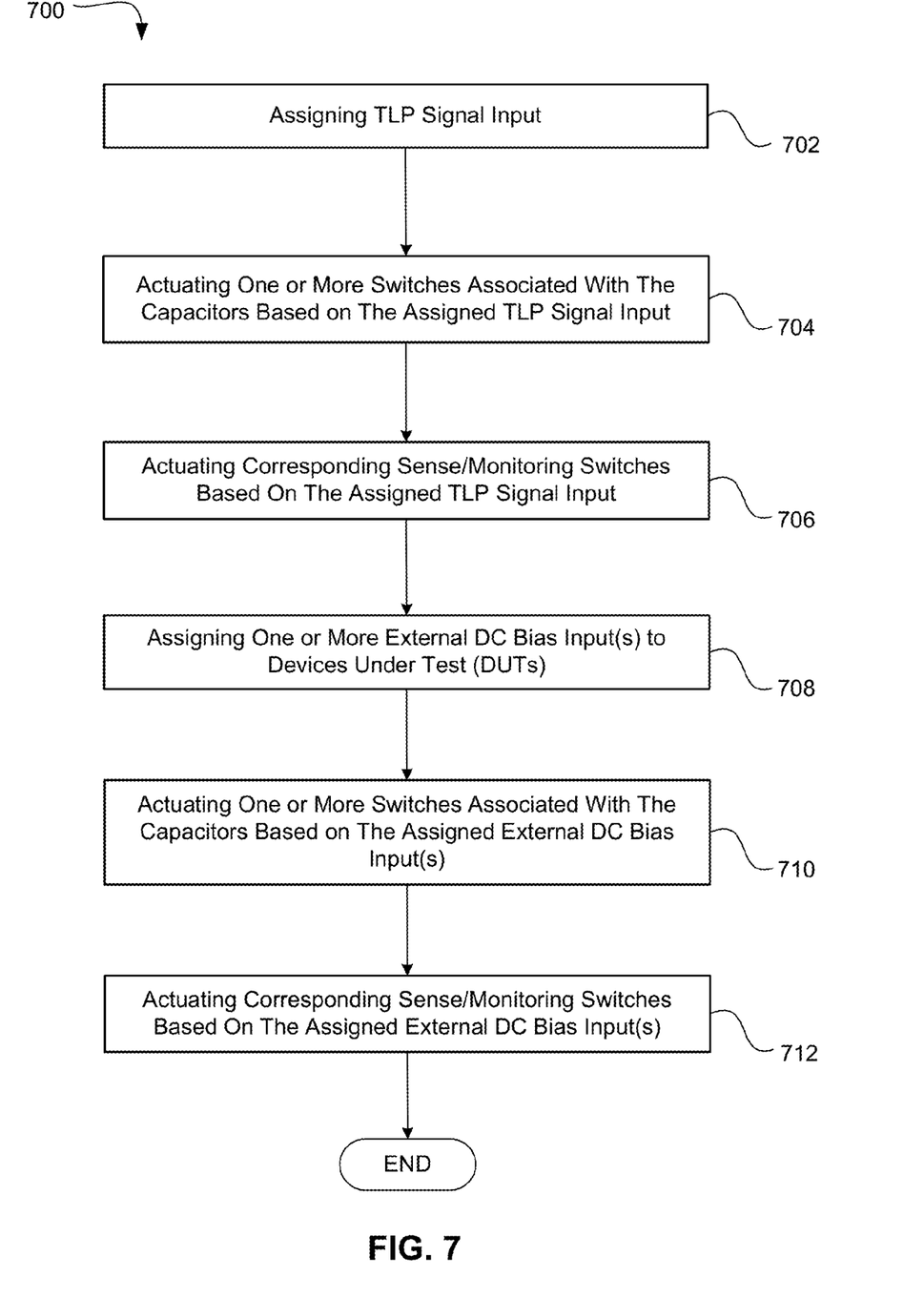
FIG. 7 is an exemplary operational flow diagram associated with the automated test system embodiment of FIG. 6.

FIG. 7 refers to an operational flow diagram 700 for configuring the switch positions of automated test system 600. The operation of flow diagram 700 may be implemented within a controller device as a set of computational instructions (e.g., a computer program). As previously indicated, the first plurality or bank of switches 602, the second plurality or bank of switches 608, and the plurality or bank of capacitors 604 associated with the first plurality of switches 602 may be configured based on connecting the TLP pulse generator and the external DC bias voltage sources to several assigned inputs (e.g., I/P1-I/PN). Also, the monitoring/sensing outputs (e.g., O/P1-O/PN) are assigned in accordance with the assigned inputs (e.g., I/P1-I/PN).

FIG. 7 is described with the aid of FIG. 6. For the TLP signal input, two inputs may be assigned (e.g., I/P1, I/P4), where the first input (e.g., I/P1) connects to the TLP pulse generator output and the second input (e.g., I/P4) connects to the TLP pulse generator's ground (702). The switch (e.g., S1) corresponding to the input (e.g., I/P1) that connects to the TLP pulse generator's output is actuated to the open position so the capacitor (e.g., C1) is not connected to the floating ground 606 (704). The switch (e.g., S8) that corresponds to the sense/monitor side output (e.g., O/P1) for monitoring the TLP pulse received at the input (e.g., I/P1) is also actuated to the open position in order for the sense/monitor side output to not be connected to the floating ground 606 (706). The switch (e.g., S4) corresponding to the input (e.g., I/P4) that connects to the TLP pulse generator ground is also actuated to the open position so the capacitor (e.g., C4) is not connected to the floating ground 606 (710).

For each external DC bias input, an input may be assigned (e.g., I/P2, I/P3), where the input (e.g., I/P2, I/P3) connects to the external bias voltage generator's output (708). The switches (e.g., S2, S3) corresponding to the inputs (e.g., I/P2, I/P3) that connect to the external bias voltage generator outputs are actuated to the closed position so the capacitors (e.g., C2, C3) are connected to the floating ground 606 (710) for compensating for ESD testing-based ground transient pulse signals. The switches (e.g., S6, S7) that correspond to the sense/monitor side outputs (e.g., O/P2, O/P3) for monitoring the external bias voltages received at the inputs (e.g., I/P2, I/P3) are actuated to the open positions in order for the sense/monitor side outputs (e.g., O/P2, O/P3) to not be connected to the floating ground 606 (712). The switch (e.g., S5) that corresponds to the sense/monitor side output (e.g., O/P4), which is associated with the ground input (e.g., I/P4), is actuated to the closed position in order for the sense/monitor side output (e.g., O/P4) to be connected to the floating ground 606 (712) along with ground connection 611 and ground input 612. Thus, the actuation of S5 connects the low-current local ground associated with device under test to the high-current system ground of the TLP pulse generator via the floating ground 606 of the automated test system 600.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electro-static discharge (ESD) test system operable to test ESD capabilities of an integrated circuit, the system comprising:
   a floating ground connection;
   a first plurality of switch devices;
   a first plurality of contacts each operably coupled to the floating ground connection via a corresponding one of the first plurality of switch devices;
   a second plurality of switch devices;
   a plurality of charge storage devices each having a first terminal and a second terminal, the first terminal of each of the plurality of charge storage devices operably coupled to the floating ground connection via a corresponding one of the second plurality of switch devices; and
   a second plurality of contacts each both operably coupled to one of the second plurality of switch devices within the integrated circuit and coupled to the second terminal of a corresponding one of the plurality of charge storage devices.

2. The system of claim 1, further comprising a controller operable to control the first plurality of switch devices and the second plurality of switch devices,
   wherein one of the controlled first plurality of switch devices is in a closed position and a corresponding one of the controlled second plurality of switch devices is in an open position for coupling a low-current ground to a high-current ground via the floating ground connection,
   and
   wherein at least a second one of the controlled first plurality of switch devices is in an open position and a corresponding at least second one of the controlled second plurality of switch devices is in an open position for receiving an ESD simulated signal,
   and
   wherein at least a third one of the controlled first plurality of switch devices is in an open position and a corresponding at least third one of the controlled second plurality of switch devices is in a closed position for receiving an external DC bias voltage.

3. The system of claim 1, wherein the plurality of charge storage devices comprises a plurality of capacitor devices each having a range of about 1-100 Nanofarads (nF).

4. The system of claim 1, further comprising:
   a direct current (DC) voltage source operable to provide at least one DC bias voltage to at least one of the second plurality of contacts, wherein each of the plurality of charge storage devices associated with the at least one of the second plurality of contacts receiving the DC bias voltage is coupled to the floating ground connection by closing a corresponding one of the plurality of second switch devices associated with the at least one of the second plurality of contacts.

5. The system of claim 4, further comprising:
   an ESD signal generating device operable to provide an ESD simulated signal to at least one other of the second plurality of contacts, wherein each of the plurality of charge storage devices associated with the at least one other of the second plurality of contacts receiving the ESD simulated signal is isolated from the floating ground connection by opening a corresponding one of the plurality of second switch devices associated with the at least one other of the second plurality of contacts.

6. The system of claim 5, further comprising:
   a signal monitoring device operable to measure at least one signal variation on the at least one of the second plurality of contacts receiving the DC bias voltage, the signal variation occurring in response to the provided ESD simulated signal.

7. The system of claim 5, wherein the ESD signal generating device comprises a transmission Line Pulse (TLP) generator.

* * * * *